United States Patent [19]
Peterson et al.

[11] Patent Number: 5,902,139
[45] Date of Patent: May 11, 1999

[54] TERMINAL BLOCK FOR CIRCUIT BOARD

[75] Inventors: John Peterson; David Saunders, both of Downsview, Canada

[73] Assignee: Digital Security Controls Ltd., Downsview, Canada

[21] Appl. No.: 08/954,069

[22] Filed: Oct. 20, 1997

[51] Int. Cl.⁶ ...................................................... H01R 9/09
[52] U.S. Cl. ............................................................ 439/79
[58] Field of Search ............................... 439/79, 80, 320, 439/709, 710, 711

[56] References Cited

U.S. PATENT DOCUMENTS 4,150,863  4/1979  Krafthefer et al. ...................... 439/80
4,174,147  11/1979  Waddington et al. .................. 439/709
4,717,218  1/1988  Ratcliff ..................................... 439/79

*Primary Examiner*—Neil Abrams
*Assistant Examiner*—T. C. Patel

[57] ABSTRACT

The terminal block of the present invention provides both a simple high strength mechanical connection with a circuit board as well as a good electrical connection. The terminal block has a snapfit with a side edge of the circuit board due to a cooperation between pins of the terminal block and holes through the circuit board. The terminal block simplifies assembly and improves the mechanical connection of the terminal block with the circuit board.

2 Claims, 2 Drawing Sheets

TERMINAL BLOCK FOR CIRCUIT BOARD

FIELD OF THE INVENTION

The present invention relates to terminal blocks for connecting with circuit boards and in particular relates to terminal blocks which are more easily connected to circuit boards.

BACKGROUND OF THE INVENTION

It is well known to have a terminal block connector secured to a circuit board which allows securement of wires to the circuit board via mechanical connectors of the block terminal. Such terminal blocks are typically soldered to the circuit board and various jigs are used to position the terminal block for the soldering step. Pins of the terminal block extend over the board and connect with soldering lands on the board.

These prior art arrangements require good dexterity in soldering of the pins to the circuit board without movement of the terminal block while achieving a good electrical connection. These operations require considerable time and care as it is imperative to the successful operation of the circuit board to have the proper connections. Even with proper connection an installer connecting the wires to the terminal block can break a connection of the terminal block to the circuit board rendering the unit unsatisfactory and resulting in its return.

The present invention overcomes a number of these shortcomings and provides a connecting arrangement which is strong and easier to install.

SUMMARY OF THE INVENTION

A terminal block for a circuit board according to the present invention comprises a body portion, a plurality of pins with each pin extending outwardly and terminating with a downwardly extending end. A pivot ledge is provided along one edge of said body portion which cooperates with said pins to define a circuit board capture recess. Said downwardly extending ends cooperate with said pivot ledge to define a narrow throat through which an edge of a circuit board can be inserted.

According to an aspect of the invention the plurality of pins have downwardly extending ends of a length greater than the thickness of a circuit board.

A terminal block according to a further aspect of the invention has the downwardly extending ends of the pins at 90° to the outwardly extending portion of the pins.

According to yet a further aspect of the invention the pins are outwardly movable against an inherent pin bias urging the pins to the original position.

According to a further aspect of the invention a free end of each pin includes a tapered surface for guiding of said pins during initial connection with a circuit board.

A terminal block according to an aspect of the invention includes in said body a screw terminal associated with each pin for electrically connecting a wire to the respective pin.

A terminal block according to an aspect of the invention has the downwardly extending ends of the pins arranged to allow limited distortion outwardly from an original condition to a distorted position and when distorted provides a spring bias urging the pin to return to the original condition.

A terminal block according to another aspect of the invention comprises a body portion, at least one pin with each of said at least one pin extending outwardly and terminating with a downwardly extending end. A pivot ledge is provided along one edge of said body portion which cooperates with said at least one pin to define a circuit board capture recess, said downwardly extending end cooperating with said pivot ledge to define a narrow throat through which an edge of a circuit board can be inserted.

The present invention is also directed to the combination of a circuit board and terminal block. The terminal block comprises a body portion, a plurality of pins with each pin extending outwardly and terminating with a downwardly extending end. A pivot ledge is provided along one edge of said body portion which cooperates with said pins to define a circuit board capture recess. Said downwardly extending ends cooperate with said pivot ledge to define a narrow throat through which a side edge of a circuit board can be inserted. The circuit board adjacent said side edge includes a plurality of holes which receive the downwardly extending ends of said pins. In addition, a portion of said side edge of said circuit board is trapped within said capture recess thereby maintaining the position of said pins for soldering to said circuit board.

BRIEF DESCRIPTION OF THE DRAWINGS

Preferred embodiments of the invention are shown in the drawings, wherein.

DETAILED DESCRIPTION OF THE PREFERRED EMBODIMENTS

Figure 1:
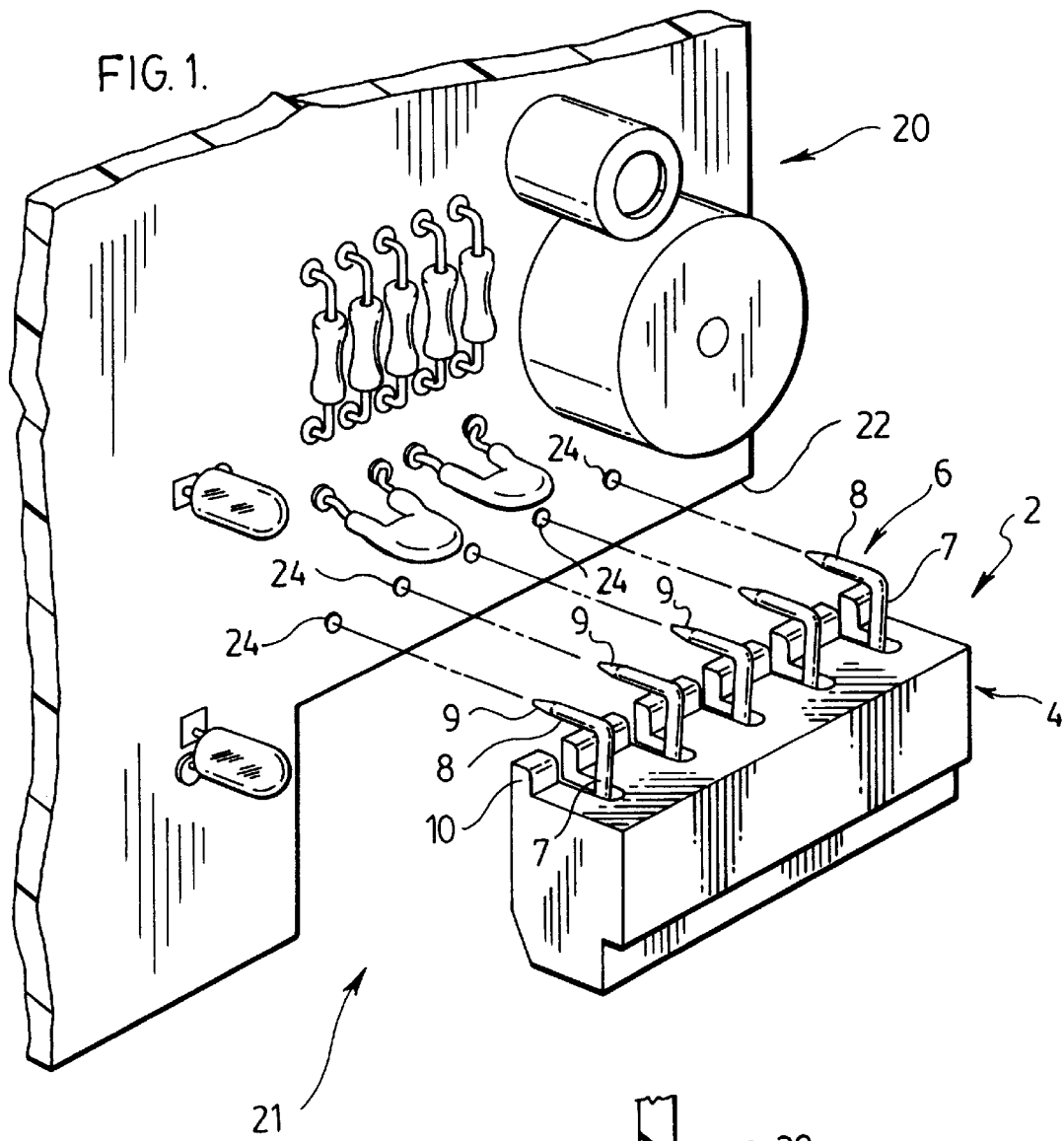
FIG. 1 is a partial perspective view of the circuit and terminal block.

The terminal block 2 includes a body portion 4 with a plurality of outwardly extending pins 6. Each pin has an outwardly extending portion 7 and a downwardly extending portion 8. The ends of the pins include a tapered point 9. A capture ledge 10 is shown in FIGS. 1 and 2 and in the case of FIG. 1, has been interrupted to allow the pins and wire connectors to be inserted into the body portion.

The circuit board 20 has a notched region 21 which defines an edge portion 22 for connection with the terminal block 2. It can be seen that the downwardly extending ends of the pins cooperate with the capture ledge 10 of the body portion to define a circuit board capture recess shown as 30.

Figure 2:
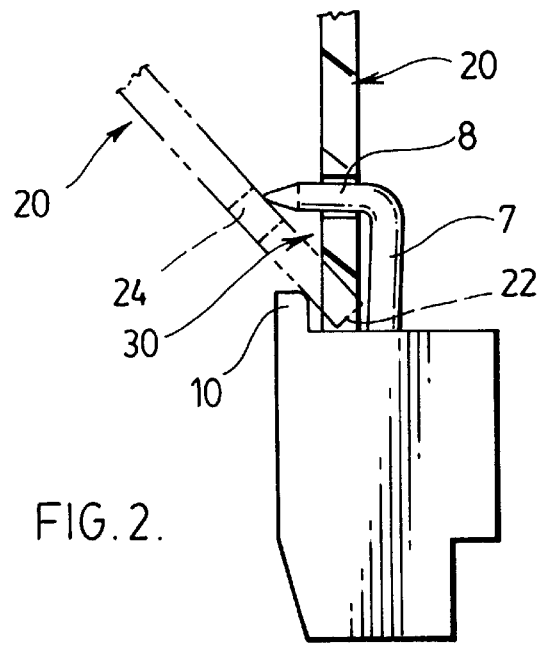
FIG. 2 is a sideview of the terminal block being connected to a circuit board.

FIG. 2 shows connection of the circuit board 10 with the terminal block 2. The circuit board is angled to position the edge 22 within the capture recess 30. The offset holes 24 are aligned with the downwardly extending ends 8 of the pins 6 and the tapered point 9 of each pin can enter the respective offset hole 24. Once the holes 24 have been properly aligned with the ends 8 the circuit board may be rotated to the 90° position shown in FIG. 2. This requires some outward distortion or deforming of the downwardly extending end portion 8 of each pin. With this arrangement a snap type fit positively retaining the circuit board in the capture region 30. Basically the pins are slightly distorted during the rotation of the circuit board and they are positively retained in the capture recess 30 and behind the capture ledge 10.

Figures 3, 4:
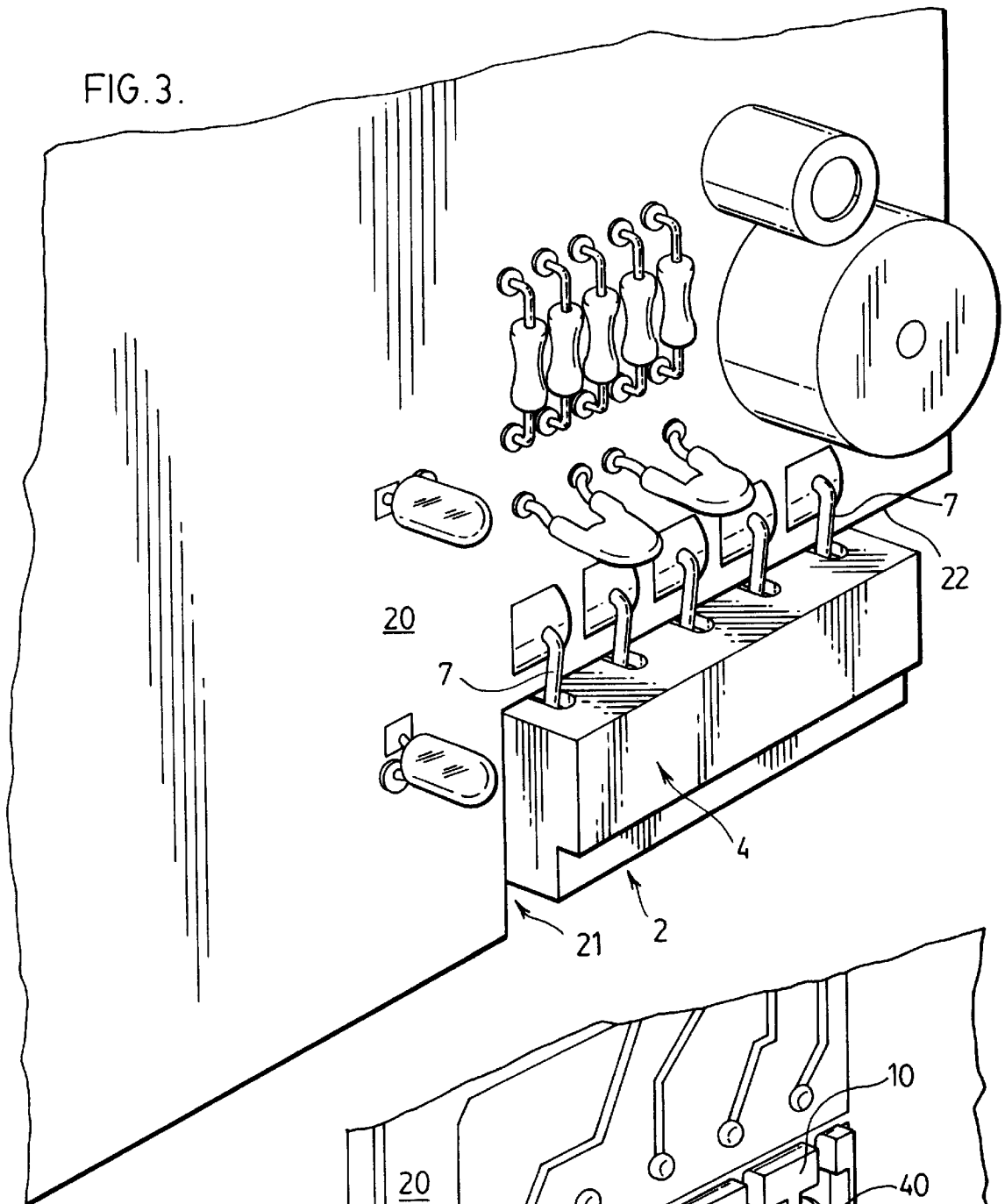
FIG. 3 is a partial perspective view of a terminal block connected to a circuit board.
FIG. 4 is a partial rear perspective view of the terminal block connected to a circuit board.

FIGS. 3 and 4 clearly show how the terminal block 2 has been connected to the circuit board 10. The downwardly extending ends 8 of the pins 6 pass through the circuit board and provide a strong mechanical connection with the circuit board. The pins on the bottom side can be soldered to the circuit board in the traditional manner further strengthening the mechanical connection. The electrical connection of the pins to the circuit board is easily accomplished on the top or the bottom surface.

FIG. 4 clearly illustrates how the body portion 4 of the terminal block 2 has recessed cavities which receive the mechanical connectors 40 for securing of wires to the circuit board. In this way, the wires are connected to the terminal block 2 and the terminal block forms the electrical connection with the circuit board. The mechanical fasteners 40 can include the pins 6 and in this case, as shown on the body portion, can have the recesses for this mechanical connection arrangement to allow them to be inserted and snap fitted within the terminal block. Other securing arrangements are also possible.

It has been found with the present invention that the terminal block provides an excellent simple arrangement for initially positioning of the terminal block in a position for soldering the circuit board 20 and it greatly simplifies the soldering as the pin is exposed on the rear surface of the circuit board or is maintained in the position on the top surface of the circuit board. In any event the requirement for jigs and or fine position and expertise in making the connection is significantly reduced.

The present invention has been described in detail with respect to a terminal block having a plurality of pins, however the invention works well with terminal blocks having any number of pins. Thus the present invention will be applicable to terminal blocks having one or more pins. In some circumstances, terminal blocks are formed by building up the block from a number of individual units, each of the units having one or more pins. The present invention is also applicable to such terminal blocks and the individual units utilized in the terminal blocks.

Although various preferred embodiments of the present invention have been described herein in detail, it will be appreciated by those skilled in the art, that variations may be made thereto without departing from the spirit of the invention or the scope of the appended claims.

The embodiments of the invention in which an exclusive property or privilege is claimed are defined as follows:

1. In combination a circuit board and a terminal block said terminal block comprising a body portion, a plurality of pins extending outwardly beyond said body portion and terminating with downwardly extending ends, a pivot ledge along one edge of said body portion which cooperates with the portion of said pins extending beyond said body portion to define a circuit board capture recess, said downwardly extending ends cooperating with said pivot ledge to define a narrow throat through which a recessed edge of said circuit board is inserted; said circuit board adjacent said recessed edge including a plurality of holes spaced from said recessed edge to receive the downwardly extending ends of said pins when said recessed edge is located in said narrow throat and against said pivot ledge in preparation for securing said terminal block to said circuit board, and wherein said recessed edge of said circuit board is trapped within said capture recess with said downwardly extending ends of said pins being distorted in a direction back towards said pivot ledge to produce a force maintaining the position of said pivot ledge against said recessed edge of said circuit board due to an interference fit therebetween and to maintain the position of said pins in said plurality of holes for soldering to said circuit board.

2. In combination as claimed in claim 1 said circuit board includes about each hole a pad for forming part of the solder connection with said respective pin.

* * * * *